United States Patent [19]
Van Haare et al.

[11] Patent Number: 5,994,496
[45] Date of Patent: Nov. 30, 1999

[54] CONJUGATED POLYMER IN AN OXIDIZED STATE

[75] Inventors: Johannes A. E. H. Van Haare, Eindhoven; Rene A. J. Janssen, Heeze; Dagobert M. De Leeuw, Eindhoven, all of Netherlands

[73] Assignee: U.S. Philips Corporation, New York, N.Y.

[21] Appl. No.: 09/186,736

[22] Filed: Nov. 5, 1998

[30] Foreign Application Priority Data

Nov. 5, 1997 [EP] European Pat. Off. .............. 97203435

[51] Int. Cl.$^6$ .......................... C08G 75/00; C08G 75/04
[52] U.S. Cl. .......................... 528/376; 528/373; 528/377; 428/690
[58] Field of Search ..................... 528/373, 376, 528/377; 428/690

[56] References Cited

PUBLICATIONS

"Absorption Properties of Alkoxy–Substituted Thienylene–Vinylene Oligomers as a Function of the Doping Level", by E.E. Havinga et al., Chem. Mater. 1996, vol. 8, pp. 769–776.
"Reactions of Thianthrenium Perchlorate and Thianthrenium Trichlorodiiodide", by Murata and Shine, The Journal of Organic Chemistry, vol. 34, No. 11, 1969, pp. 3368–3372.
CRC Handbook of Chemistry and Physics, 72nd Edition, pp. 8–29.
"Polymerization of 3–Alkylthiophenes with FeCl3", by V.M. Niemi et al., in Polymer Reports, Vo. 33, No. 7, 1992, pp. 1559–1562.
"Photo– and Electroluminescence Efficiency in Poly(dialkoxy–p–phenylenevinylene)", by Braun et al., in Synthetic Metals, vol. 66, 1994, pp.75–79.
"Circular Dichroism and Circular Polarization of Photoluminescence of Highly Ordered Poly(3,4–di[(s)–2–methylbutoxy]thiophene", by Langeveld–Voss et al., in Journal of the American Chemical Society, vol. 118, No. 20, pp. 4908–4909.
J.L. Ciprelli et al, Synthetic Metals, vol. 74, No. 3, 1995, "Enhanced Stability of Conducting Poly(3–Octylthiophene) Thin Films Using Organic Nitrosyl Compounds", pp. 217–222, p. 217 Second Column, First Paragraph, p. 218, Second Column, Last Paragraph, p. 219, Figures 1–3, Abstract.
R.L. Lidberg et al, Proc. Spie–Int. Soc.Opt.Eng., vol. 2397, 1995, "Optical and Electrical Properties of Doped Pioly–3–Octylthiophene Films", p. 633–642, p. 636, p. 637, First Paragraph, p. 640, First Paragraph, Figure 6, Abstract.

*Primary Examiner*—Duc Truong

[57] ABSTRACT

A conjugated polymer in an oxidized state has a doping level of 0.4 or higher. In said oxidized state the polymer is electroconductive, transparent to visible light and preferably colorless. A method of preparing such a polymer comprises the step of bringing the polymer into contact with a strong oxidative agent such as thianthrenium perchlorate. Layers of such polymers may be used as a transparent coating on a display device or as an electrode layer in an electroluminescent device.

8 Claims, 4 Drawing Sheets ic point of view. Typical values range from $10^{-3}$ to $10^3$

CONJUGATED POLYMER IN AN OXIDIZED STATE

BACKGROUND OF THE INVENTION

The invention relates to a conjugated polymer in an oxidized state and a method of preparing such a conjugated polymer.

The invention further relates to a substrate surface, in particular a surface of a display screen of a display device, provided with a layer comprising such a conjugated polymer.

The invention also relates to an electrode comprising such a conjugated polymer, and in particular to an electroluminescent device comprising such an electrode.

In the context of the invention, a conjugated polymer is a polymer (the term polymer includes copolymer, terpolymer, etc. as well as oligomer) which has a poly-conjugated system, i.e. an extensive interconnected system of double and/or triple bonds (also known as π-bonds or unsaturated bonds). Generally, the poly-conjugated system extends along the main chain (backbone) of the polymer.

As is well known in the art, the presence of a poly-conjugated system renders many conjugated polymers readily oxidizable. Thus, a conjugated polymer in a neutral state may be brought into an oxidized state by bringing said conjugated polymer into contact with an oxidative agent, whereupon a redox process occurs. As a result, a conjugated polymer in an oxidized state having an increased specific conductivity is obtained which is interesting from a technical point of view. Typical values range from $10^{-3}$ to $10^3$ S/cm. The redox process is also referred to as doping, the oxidative agent as a dopant, and the oxidized state as a doped state, whereas the conjugated polymer in an oxidized state is also referred to as a doped conjugated polymer, for short. If the charge carriers accommodated by the poly-conjugated system are positively charged, the doping is said to be p-type. If the poly-conjugated system carries almost no charge, the conjugated polymer is in the neutral or undoped state.

Layers comprising such doped conjugated polymers are electroconductive and can be suitably used for a large variety of applications. For example, a layer of such a polymer can be used as an anti-static or electromagnetic shielding coating or as an electrode layer.

Doping the conjugated polymer does not only change the electrical properties but also the optical properties associated with the conjugated polymer, such as its color and transparency in the visible range. As a general rule, it appears that conjugated polymers are, both in the doped and undoped state, highly colored and rather opaque.

This is unfortunate since in the art a clear need exists for polymers which are electroconductive, transparent to visible light and, preferably, colorless. Such polymers can be suitable used in place of or in addition to known inorganic transparent conductors such as indiumtinoxides. However, attempts to satisfy this need have been largely unsuccessful. More in particular, as exemplified by a publication by Having a et al. in Chem. Mater., vol. 8, 1996, pp 769–776, it has so far been impossible to provide a conjugated polymer in an oxidized state which is electroconductive, transparent and, preferably, colorless, if said polymer, in its neutral, state has an oxidation potential, expressed in terms of a half-wave potential, $E_{1/2}$, at room temperature, of more than 0.0 V vs the saturated calomel electrode (SCE). In this respect it is noted that both poly-3,4,ethylenedioxythiophene (PEDOT) and polyaniline (PANI), which are among the very few polymers which are known to be transparent and electroconductive in the oxidized state, have an oxidation potential in the neutral state which is significantly lower than 0.0 V vs SCE, where it is understood that the neutral undoped state of PANI is leucoemeraldine PANI. PANI is an exceptional conjugated polymer in that it has another neutral form, which is known as emeraldine base PANI.

SUMMARY OF THE INVENTION

It is an object of the invention, inter alia, to satisfy the need mentioned hereinabove. Specifically, it is an object of the invention to extend the range of conjugated polymers in an oxidized state. In said oxidized state, the polymer is to be electroconductive, transparent to visible light and, preferably, colorless. In a neutral state, its half-wave potential is to be higher than 0.0 V vs SCE. With respect to its transparency to visible light, the doped conjugated polymer is to be similar to or even better than PEDOT.

In accordance with the invention, this object is achieved by providing a conjugated polymer in an oxidized state, which in said oxidized state has a doping level of more than 0.4, and which in a neutral state, at room temperature has a half-wave potential of more than 0.0 V vs the saturated calomel electrode.

The doping level is defined as the average number of charges present on the conjugated polymer per monomeric unit of the conjugated polymer. If the conjugated polymer is brought into the oxidized state by means of an oxidative agent, the average number of charges equals the number of electrons transferred to the oxidative agent. The monomeric unit normally corresponds to the repeating unit of a conjugated polymer. It may also be smaller than the repeating unit if differences among its constituent parts are solely attributable to the presence of different substituents. In other words, the monomeric unit corresponds to the repeating unit of the bare backbone of the conjugated polymer. For example, if the repeating unit of a polymer is a 3-methoxy-bithiophene unit, the monomeric unit still is one thiophene ring.

Although the inventors have observed that in some embodiments a doping level below 0.4 may already result in an oxidized state having a transparency comparable to PEDOT, a doping level of more than 0.4 is found to be sufficient in substantially all cases. A doping level of more than 0.45, or even of more than 0.5 is preferred. However, in general, the transparency does not increase significantly any more beyond a doping level of 0.6, whereas the predisposition to engage in unwanted chemical reactions does increase.

The invention is based on an insight evidently not recognized in the said publication by Having a et al., said insight being that as far as the transparency of a conjugated polymer is concerned, the doping level is a decisive parameter.

Conjugated polymers which can be suitably used in accordance with the invention are conjugated polymers which are known per se and which include polyarylenes, such as polyphenylenes, polythiophenes, and polyarylenevinylenes such as polyphenylenevinylenes, and polythienylenevinylenes as well as poly(oligo-arylene)vinylenes, with the proviso that in all cases their $E_{1/2}$ is more than 0.0 V vs SCE.

In order to improve the processibility of the solution, a said conjugated polymers are preferably provided with solubility-enhancing substituents such as alkyl and alkoxy substituents.

The charges accommodated by the conjugated polymer in the oxidized state must be balanced by counterions if charge neutrality is to be observed. Apart from the requirement that the counterion may not absorb light in the visible range, the choice of counterion is not critical. Preferably, chemically inert counterions such as $BF_4^-$, $SbF_6^-$, $PF_6^-$, $AsF_6^-$, $ClO_4^-$ or sulphonate are used.

A particular embodiment of the method in accordance with the invention is characterized in that the conjugated polymer is a polythiophene, a polythienylenevinylene or a polyphenylenevinylene. If these polymers are in an oxidized state with a doping level above 0.4, they are not only electroconductive and transparent to visible light but colorless as well. Furthermore, the half-wave potential is conveniently located between 0.0 and 1.0 V vs SCE, which allows doping levels of more than 0.40 to be obtained by means of (strong) oxidative agents known per se and examples of which are provided hereinbelow. Also, said polymers may be oxidized substantially reversibly, indicating a small predisposition to undergo undesirable (irreversible) side-reactions.

Preferred polythiophenes are soluble (di)alkyl and (di) alkoxy polythiophenes. Examples include poly(3-octyl-2,5-thiophene) and poly(3,4-di(2-methylbutoxy)-2,5-thiophene) which are soluble in common organic solvents in both the undoped and doped state. For similar reasons, 2,5-substituted poly-1,4-phenylenevinylenes are preferred, in particular poly(2-(3,7-dimethyloctyloxy)-5-methoxy-1,4-phenylenevinylene), whereas a suitable polythienylenevinylene is poly(3,4-di(2-methylbutoxy)-2,5-thienylenevinylene).

The invention further relates to a method of preparing a conjugated polymer in an oxidized state. In accordance with the invention, this method is characterized by the preparation of a conjugated polymer in an oxidized state which in said oxidized state has a doping level of more than 0.4, in which method a conjugated polymer in a neutral state having, at room temperature, a half-wave potential of more than 0.0 V vs the saturated calomel electrode is brought into contact with an effective oxidative agent thereby forming the conjugated polymer in said oxidized state.

The method in accordance with the invention produces in a simple manner a conjugated polymer in an oxidized state with a doping level of more than 0.4 which is electroconductive, transparent to visible light and, optionally, colorless.

A condition to be met by an oxidative agent in order to be effective is that it is sufficiently strong. This is the case if the oxidation potential of the oxidative agent is significantly larger than the oxidation potential of the conjugated polymer. In general it appears that the oxidation potential needs to be significantly larger than that of the redox couple Fe(III)/Fe(II) ($E_{1/2}$=0.5–0.9 V vs SCE). In particular, oxidative agents having a half-wave potential above 1.2 V vs SCE are sufficiently strong. Furthermore, an effective oxidative agent does not engage in side-reactions to a substantial degree, a requirement which can be simply tested in an empirical manner by determining whether or not the oxidation process is substantially reversible.

In order to reach doping levels larger than 0.4 the oxidative agent has to be supplied in a sufficient quantity. Whether or not a sufficient quantity is supplied, given a specific doping level to be attained, can be simply determined empirically. In any case, a quantity shall be considered sufficient if supplying an additional quantity of oxidative agent does not lead to a further substantial charge transfer between the conjugated polymer and the oxidative agent or, equivalently, to a further increase in the doping level, but merely introduces an additional quantity of unreacted oxidative agent.

If desired, the product obtained by applying the method in accordance with the invention may be modified in that the reduced form of the oxidative agent is removed from said product. This is particularly advantageous when the quantity of oxidative agent used is large and/or the size of its constituent molecules is large. The reduced form does not (at least not favorably) contribute to the electrical conductivity. If the reduced form is ionic then removal implies ion exchange in order to maintain a charge balance.

The method may be carried out using a neat mixture of oxidative agent and conjugated polymer or in the presence of a solvent. If the product of the method is to be part of a layer, a layer of the conjugated polymer may be formed first, said layer subsequently being exposed to a solution or vapor of the oxidative agent. However, the doping levels required by the invention are most conveniently obtained by, bringing the conjugated polymer which is in solution, into an oxidized state and then forming a layer therefrom.

A preferred embodiment of the method in accordance with the invention is characterized in that the oxidative agent used, is a thianthrenium salt or a bis(trifluoroacetoxy) iodobenzene. The latter oxidative agent is preferably used in the presence of an excess amount of trifluoroacetic acid. Said oxidative agents can be suitably used to bring a conjugated polymer with a doping level of 0.4 or higher into an oxidized state. As an additional advantage, a very small predisposition to engage in irreversible side-reactions with the conjugated polymer is observed. This is the case in particular when said oxidative agents are used to oxidize a polythiophene or a polyphenylenevinylene. If such a conjugated polymer is brought into an oxidized state by means of said oxidative agents it can be brought back into its neutral state substantially quantitatively by supplying a suitable reducing agent. Moreover, said oxidative agents are soluble in a variety of common organic solvents and in particular in those solvents in which conjugated polymers such as dichloromethane are soluble.

Said oxidative agents are also suitable if a conjugated polymer in an oxidized state with a doping level below 0.4 is to be prepared.

The conjugated polymer in an oxidized state in accordance with the invention, for example prepared by means of the method in accordance with the invention, is electroconductive, transparent to visible light and, if desired, colorless. In these respects the conjugated polymer is similar to mixed oxides of indium, antimony and/or tin, such as an indiumtinoxide (ITO) and an antimonytinoxide (ATO). A layer of said inventive conjugated polymer can be used in place of or in addition to such an oxide layer in any application where use is made of such an oxide layer. An advantage of the conjugated polymer compared to the inorganic materials is that it can be readily processed (from solution) at low temperatures.

The invention further relates to a substrate surface provided with a layer comprising a conjugated polymer in an oxidized state. In accordance with the invention, its doping level is above 0.4 and may, if desired, be prepared by using a method in accordance with the invention. The advantageous properties of the conjugated polymer in accordance with the invention, such as its electrical conductivity, transparency in the visible range and, if desired its neutral color, are effectively exploited if said conjugated polymer is provided in the form of a layer. The layer may be self-supporting and used as such but it is preferably provided on a substrate surface so as to, for example, protect the underlying substrate from ambient influences. Examples of such layers are anti-static, electromagnetic shielding, electrochromic and anti-corrosion layers. The underlying substrate surface may be made of metal, ceramic or synthetic resin, quartz or a glass. The electrical conductivity of the layer is $10^{-2}$ S/cm or higher.

A suitable layer thickness is 0.01 to 100 $\mu$m or, better, 0.1 to 10 $\mu$m. The layer may be prepared using coating or printing methods known per se.

The electroconductive and transparent property of the conjugated polymer in accordance with the invention is advantageously exploited if the substrate surface is a display screen of a display device such as a (plasma-assisted) liquid crystal display device, a plasma display device or, in particular, a cathode ray tube.

The invention still further relates to an electrode comprising a conjugated polymer in an oxidized state. By using a conjugated polymer in accordance with the invention as an electrode material, an electrode composed thereof is rendered transparent to visible light and, if desired, colorless. Such an electrode is of particular use in those electrooptical devices where the electrode is to be transparent to visible light. An example of such a device is a liquid crystal device.

The electrode in accordance with the invention is capable of injecting charges, positive charges in particular, into an organic electroluminescent layer. The invention therefore also relates to an organic electroluminescent (EL) device comprising electrodes and an organic electroluminescent layer disposed therebetween, at least one of said electrodes being an electrode in accordance with the invention. The term organic is to be understood to include vacuum-deposited low molar mass organic EL compounds as well as EL polymers.

BRIEF DESCRIPTION OF THE DRAWING

These and other aspects of the invention will be apparent from and elucidated with reference to the embodiments described hereinafter.

In the drawings.

DESCRIPTION OF THE PREFERRED EMBODIMENTS

Exemplary Embodiment 1

This first exemplary embodiment relates to a doping experiment in which a number of samples is prepared and of each of said samples an absorption spectrum is recorded, each sample comprising the conjugated polymer poly(3-octylthiophene) in an oxidized state having a specific doping level. The doping experiment is performed as follows:

Firstly, a solution of the oxidative agent thianthrenium perchlorate (I) is prepared (solution A).

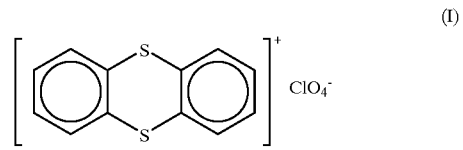

Thianthrenium perchlorate is synthesized, according to the method described in a publication by Murate and Shine in J. Org. Chem., vol. 34, 1969, p 3368 in the following way:

In an inert atmosphere of dry nitrogen, 0.8 ml perchloric acid (Acros, pa 70% solution in water) is added dropwise to 50 ml acetic acid, said operation being performed carefully in order to avoid excessive accumulation of heat. While stirring, 0.52 g (2,36 mmol) thianthrene (Aldrich, 97%) in 10 ml tetrachloromethane (Acros, pa) is then added to the resulting orange solution. The deep-purple solution thus obtained is stirred at room temperature for 20 h and a purple precipitate substantially consisting of thianthrenium perchlorate forms which is filtered off using a glass filter. After washing the filtrate several times with tetrachloromethane in order to remove any residual acetic acid the filtrate is vacuum dried. The filtrate is a purple solid. The yield is 0.61 g (1.93 mmol, 82%).

The filtrate is then dissolved in dichloromethane so as to obtain a solution of thianthrenium perchlorate (I), the exact concentration of (I) then being determined by means of a titration with KI in acetonitrile.

The half-wave potential at room temperature of the thianthrenium radical cation is 1.28 V vs SCE (CRC Handbook of Chemistry and Physics, 72nd edition, CRC press, p 8–29).

Secondly, a solution of poly(3-octylthiophene), the repeating unit of which is represented by the formula (T1), is prepared (solution B).

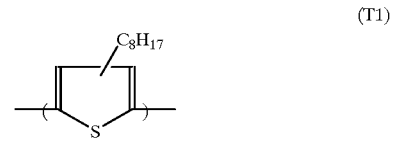

The conjugated polymer poly(3-octylthiophene) is synthesized according to the method described by Niemi et al. in Polymer Reports, vol. 33, 1992, pp 1559–1562, and subsequently dissolved in dichloromethane so as to obtain a $5.6 \times 10^{-5}$ M solution, the concentration being calculated on the basis of the unit T1.

The half-wave potential at room temperature, as determined by a procedure similar to that described in the publication by Having a et al., is 0.6 V vs SCE.

Figure 1:
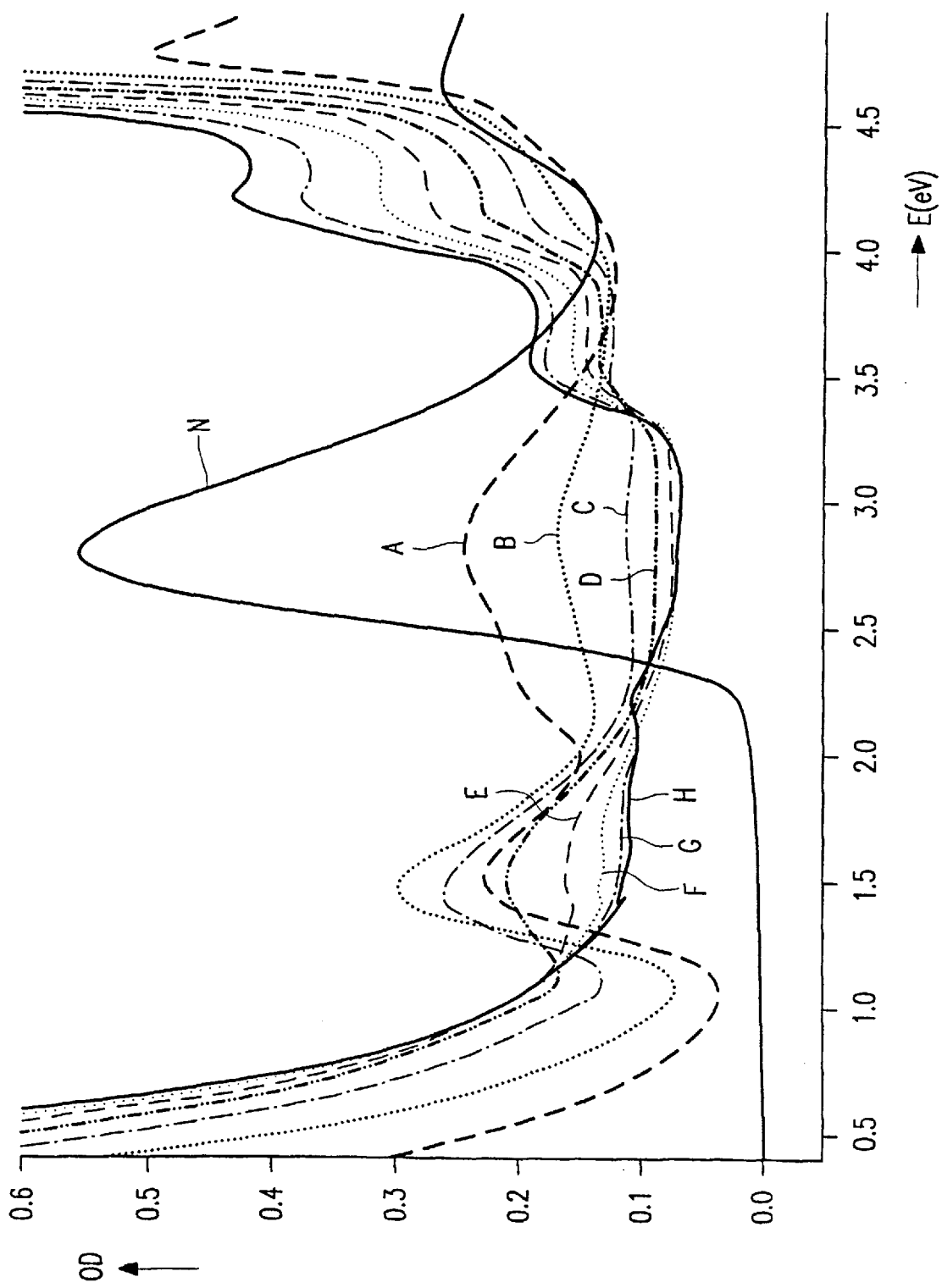
FIG. 1 shows a number of absorption spectra, represented as the optical density OD (in dimensionless units) as a function of the photonic energy E (in eV), at different doping levels of a first conjugated polymer in an oxidized state.

Thirdly, in an inert atmosphere ([$O_2$]<1 pmm, [$H_2O$]<5 ppm), 2.1 ml of solution B is mixed with a 25 $\mu$l of solution A, thereby bringing the oxidative agent thianthrenium perchlorate (I) into contact with poly(3-octylthiophene). An oxidation reaction occurs as a result of which a solution of poly(3-octylthiophene) in an oxidized state is obtained. The perchlorate anion serves as the counterion. The absorption spectrum of the solution is then recorded in the UV/vis/near-IR range of the electromagnetic spectrum in a cuvette having a path length of 1 cm. Referring to FIG. 1, it is the absorption spectrum labelled A. A further aliquot of solution A is added and the absorption spectrum recorded again thus obtaining the spectrum labelled B in FIG. 1. The procedure of adding further quantities of solution A and recording the absorption spectrum is repeated a number of times so as to obtain the spectra labelled C-H. For comparison, the absorption spectrum of solution B, labelled N in FIG. 1, is recorded as well; it corresponds to poly(3-octylthiophene) in a neutral state.

The reaction between the oxidative agent (I) and poly(3-octylthiophene) apparently proceeds quantitatively up to and including sample G. The spectrum of sample H shows small absorption peaks at 2.25 eV and 4.25 eV, said peaks being characteristic of (unreacted) thianthrenium perchlorate. From the number of moles of oxidative agent added, the doping level can be calculated. The monomeric unit relevant for calculating the doping level is the repeating unit (T1). The doping levels thus obtained are given in table 1.

TABLE 1

| sample | N | A | B | C | D | E | F | G | H |
|---|---|---|---|---|---|---|---|---|---|
| doping level | 0.00 | 0.08 | 0.17 | 0.25 | 0.34 | 0.42 | 0.50 | 0.59 | 0.67 |

Referring to table 1, it is observed that the samples labelled E, F, G and H provide a poly(3-octylthiophene) in an oxidized state having a doping level above 0.4 and are thus in accordance with the invention, whereas samples N, A–D are not. Due to the presence of (I), the doping level of sample H is slightly overestimated.

Referring to FIG. 1, it is observed that the optical density between 1.50 eV and 3.25 eV of the samples E to H does not exceed 0.15 which corresponds to a molar extinction coefficient of $0.25 \times 10^4$ l.mol$^{-1}$.cm$^{-1}$. This value is comparable to or even lower than the corresponding value obtained for PEDOT. This indicates that the conjugated polymer of said samples is transparent to visible light, the visible range roughly corresponding to photonic energies (wavelengths) of about 1.80 eV (690 nm) to 2.90 eV (430 nm). Furthermore, the optical density remains substantially constant across the visible range indicating that the said samples are, in accordance with the invention, colorless. Also, at doping levels of 0.42 or larger, the absorption spectrum in the visible range remains substantially the same.

In order to demonstrate that even at the highest doping levels, side-reactions have not occurred, an excess quantity of the reducing agent hydrazine monohydrate is added to sample H and the absorption spectrum recorded. The result is that the absorption spectrum labelled N is substantially recovered indicating that the oxidation is substantially reversible.

Similar results are obtained if the doping experiment is repeated using as oxidative agent bis(trifluoroacetoxy) iodobenzene (II) (commercially available from Aldrich) in the presence of an excess amount of trifluoroactic acid.

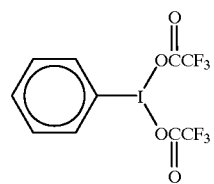

(II)

Exemplary Embodiment 2

A glass substrate surface which, in accordance with the invention, is provided with a layer of poly(3-octylthiophene) in an oxidized state is prepared as follows:

In an inert atmosphere, a 6.5 mM dichloromethane solution of poly(3-octylthiophene) in an oxidized state having a doping level of 0.50 to 0.55 is prepared by adding the corresponding quantity of the oxidative agent (I) and filtering over a 1 µm filter. The solution is applied in the form of a film on a glass substrate by means of drop casting. After evaporation of the solvent, a layer of 1.0 µm is obtained.

As determined by means of a conventional four-probe method, the specific conductivity of the material of which the layer consists is 0.2–0.4 S/cm, demonstrating that the conjugated polymer in accordance with the invention is electroconductive. As the layer contains a large quantity of thianthrene, which is not electroconductive, the measured electrical conductivity underestimates the electrical conductivity of the doped conjugated polymer.

Figure 2:
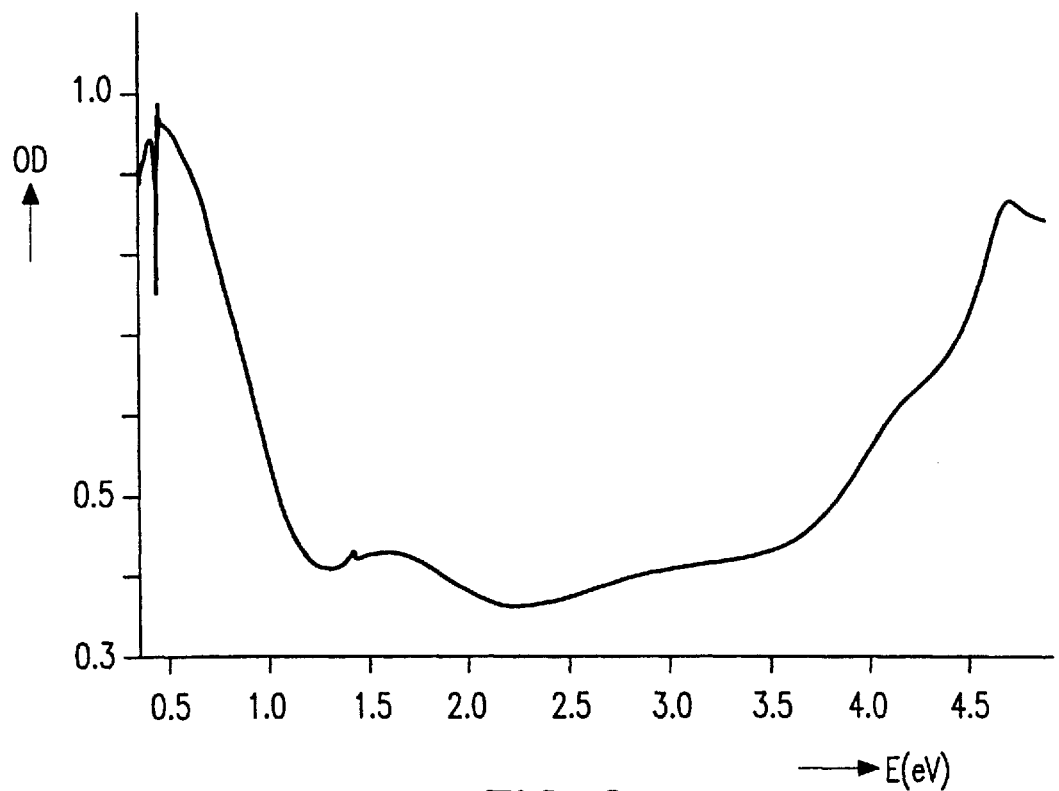
FIG. 2 shows an absorption spectrum, represented as the optical density OD (in dimensionless units) as a function of the photonic energy E (in eV), of a layer comprising the first conjugated polymer in an oxidized state having a doping level in accordance with the invention, FIGS. 3 to 5 each show a number of absorption spectra, represented as the optical density OD (in dimensionless units) as a function of the photonic energy E (in eV), at different doping levels of a number of conjugated polymers in an oxidized state, FIG. 6 schematically shows a cut-away view of a cathode ray tube in accordance with the invention, FIG. 7 schematically shows a cross-sectional view of an electroluminescent device in accordance with the invention.

In FIG. 2, the absorption spectrum of the layer is shown. The optical density per cm in the visible range is less than $0.4 \times 10^4$ cm$^{-1}$, where it is understood that the absorption is in fact partially due to scattering induced by thianthrene which is present in said layer as crystallites. Said value is at least comparable to, or maybe even lower than, the value obtained for PEDOT. With a variation of the optical density per cm within the visible range of $0.05 \times 10^4$ cm$^{-1}$ the layer is also colorless.

Exemplary Embodiment 3

The doping experiment performed in exemplary embodiment 1 is repeated with this difference that for the conjugated polymer use is made of poly(2-(3,7-dimethyloctyloxy)-5-methoxy-1,4-phenylenevinylene) (DA-PPV), of which the repeating unit is represented by the formula (T2).

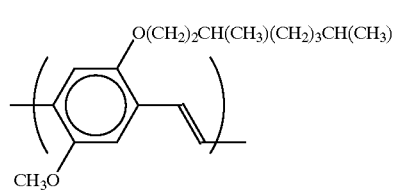

(T2)

Said polymer may be synthesized according to a method published by Braun et al. in Synth. Met., vol 66, 1994, pp 75–79. The concentration of DA-PPV in the dichloromethane solution is $3.3 \times 10^{-4}$ M, its oxidation potential at room temperature $E_{1/2}$=0.85 vs SCE. The monomeric unit on which the calculation of the doping level and concentration is based is the repeating unit (T2). The path length of the cuvette is 0.1 cm.

Figure 3:
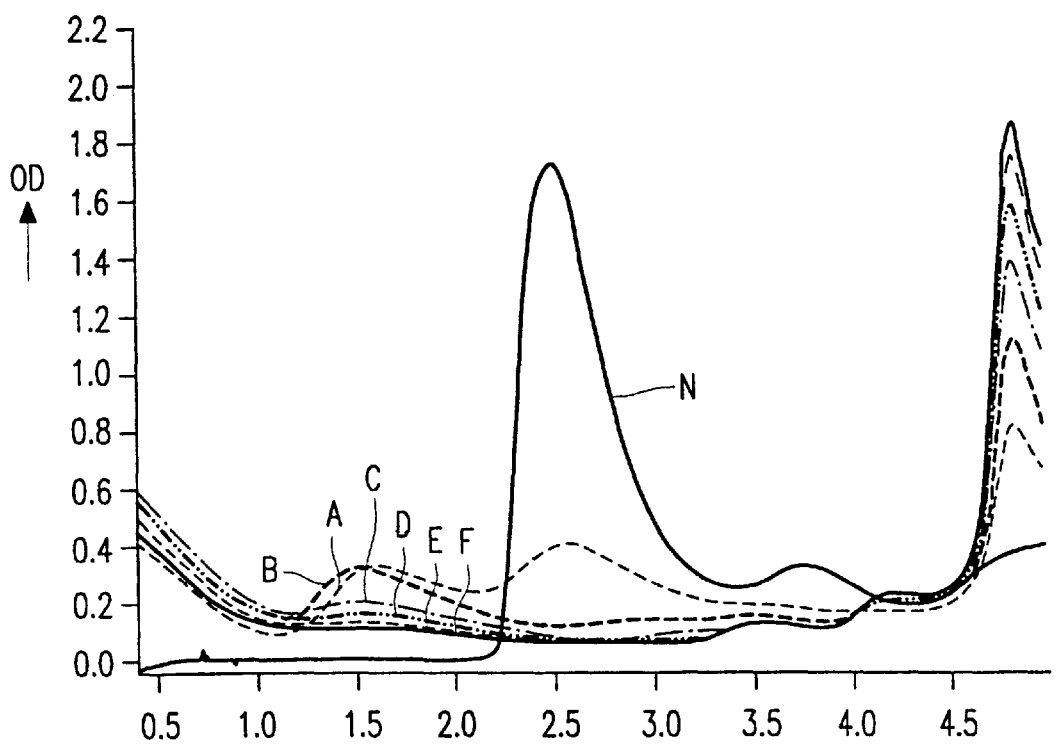

FIG. 3 shows the absorption spectra of the samples A–F, of which the doping levels are listed in table 2.

TABLE 2

| sample | N | A | B | C | D | E | F |
|---|---|---|---|---|---|---|---|
| doping level | 0.00 | 0.09 | 0.17 | 0.25 | 0.34 | 0.43 | 0.51 |

The reaction between the oxidative agent (I) and DA-PPV apparently proceeds quantitatively, since none of the absorption spectra A–E show the absorption peaks at 2.25 eV and 4.25 eV which are characteristic of (unreacted) thianthrenium perchlorate.

At 2.1 eV, which is a typical value within the visible range of the spectrum, the molar extinction coefficient at a doping level of 0.43 or higher is $0.3\times10^4$ $l.mol^{-1}.cm^{-1}$ which is comparable to the corresponding value of PEDOT. Moreover, the optical density is substantially constant across the visible range indicating that, in accordance with the (particular embodiment of the) invention, at least at doping levels higher than 0.4 the conjugated polymer is transparent and colorless.

Exemplary Embodiment 4

The doping experiment of exemplary embodiment 1 is repeated with this difference that for the conjugated polymer use is made of poly(3,4-di(2-methylbutoxy)thiophene) (AO-PT), of which the repeating unit is represented by formula (T3).

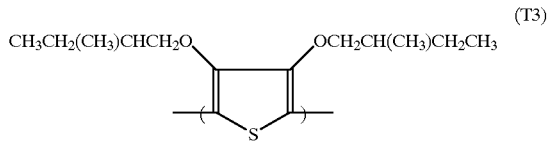
(T3)

Said polymer may be synthesized according to the procedure described by Langeveld-Voss et al. in J. Am. Chem. Soc., vol. 118, 1996, pp 4908–4909. The concentration of AO-PT in the dichloromethane solution is $8.2\times10^{-5}$ M, its oxidation potential at room temperature $E_{1/2}$=0.40 vs SCE. The monomeric unit on which the calculation of the doping level and concentration is based is the repeating unit (T3). The path length of the cuvette is 1 cm.

Figure 4:
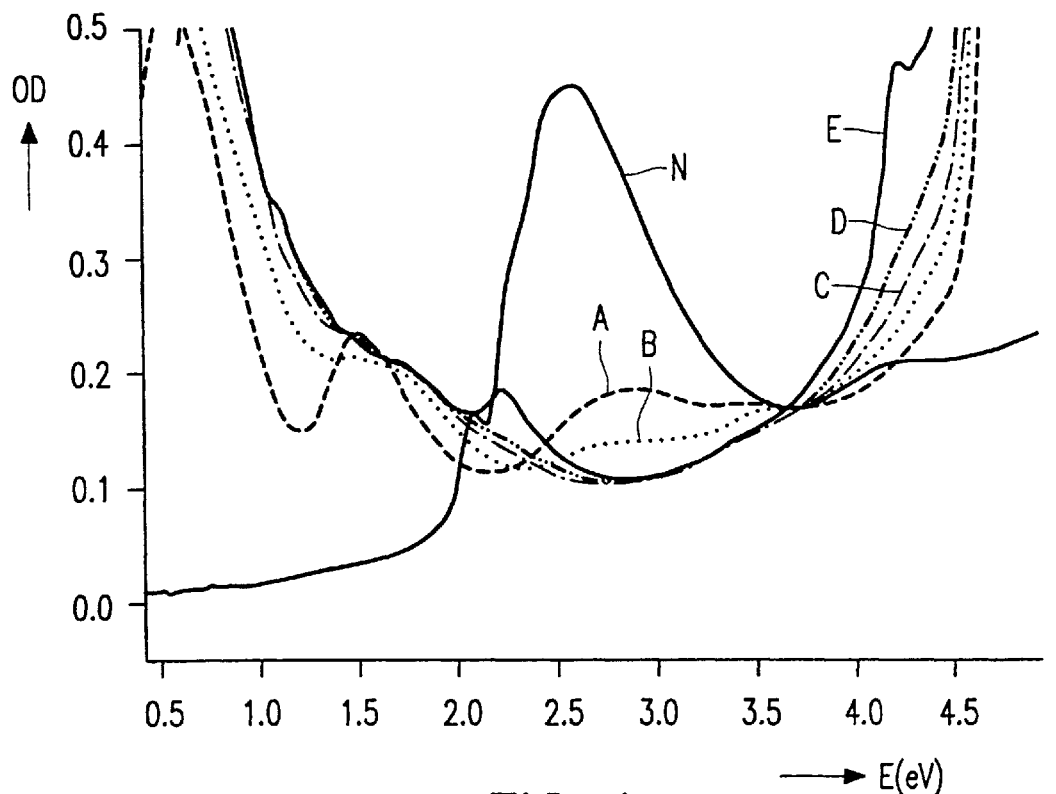

FIG. 4 shows the absorption spectra of the samples A to E of which the doping levels are listed in table 3. For comparison, a sample labelled N of the undoped polymer is included.

TABLE 3

| sample | N | A | B | C | D | E |
|---|---|---|---|---|---|---|
| doping level | 0.00 | 0.16 | 0.32 | 0.48 | 0.64 | 0.80 |

At the highest doping level, i.e. 0.80, the reaction between the oxidative agent (I) and AO-PT does not proceed quantitatively since the absorption spectrum labelled E shows the absorption peaks at 2.25 eV and 4.25 eV which are characteristic of(unreacted) thianthrenium perchlorate. The actual doping level of sample E is therefore less than 0.80.

In accordance with the (particular embodiment of the) invention, at least at a doping level higher than 0.4, the transparency in the visible range is comparable to PEDOT. Furthermore, highly doped AO-PT is colorless.

Exemplary Embodiment 5

The doping experiment of exemplary embodiment 1 is repeated with this difference that for the conjugated polymer use is made of poly(3,4-di(2-methylbutoxy)-2,5-thienylenevinylene)(AO-PTV), of which the repeating unit is represented by formula (T4).

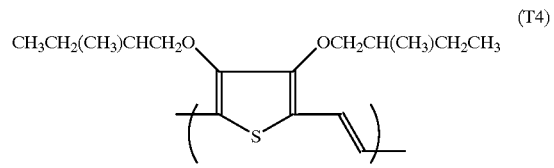
(T4)

Said polymer may be synthesized according to the procedure described in the publication by Having a et al. According to said publication, the half-wave potential of AO-PTV is 0.57 V vs SCE. The concentration of AO-PTV is $7.2\times10^{-5}$ M. The monomeric unit on which the calculation of the doping level and concentration is based is the repeating unit (T4). The path length of the cuvette is 1 cm.

Figure 5:
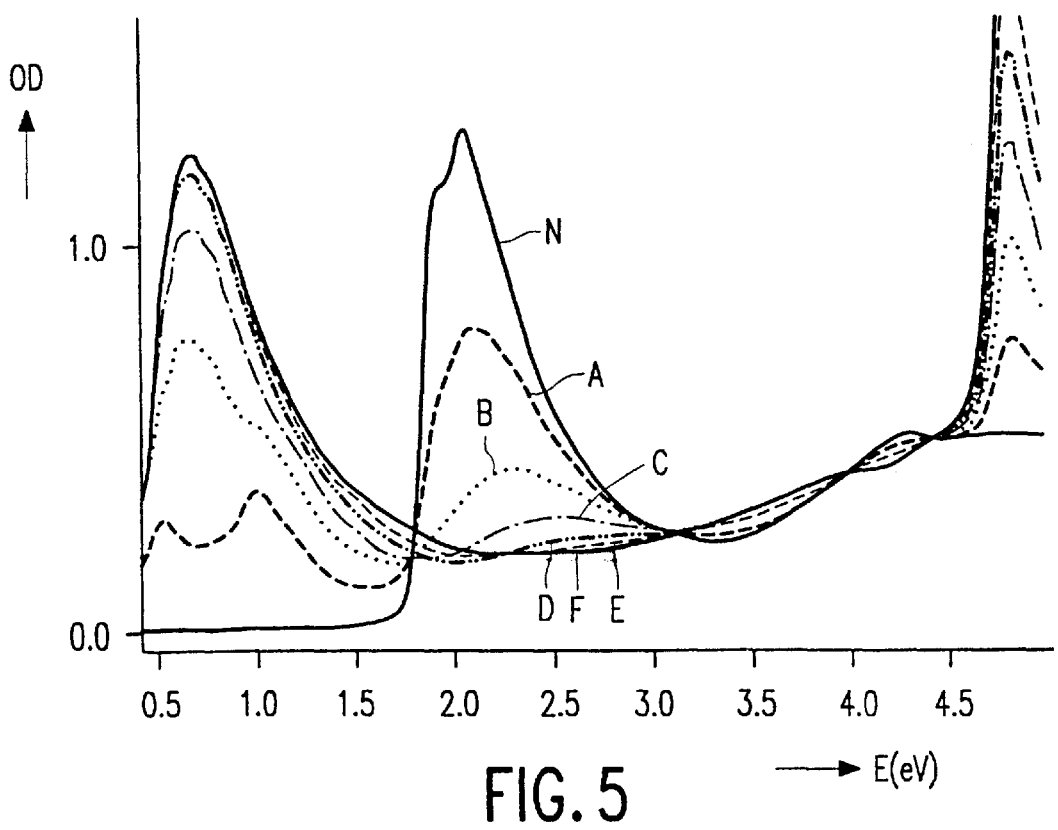

FIG. 5 shows the absorption spectra of the samples A to F, whereas table 4 lists the doping levels thereof. For comparison, a sample labelled N of the undoped polymer is included.

TABLE 4

| sample | N | A | B | C | D | E | F |
|---|---|---|---|---|---|---|---|
| doping level | 0.00 | 0.10 | 0.19 | 0.28 | 0.37 | 0.46 | 0.55 |

The reaction between the oxidative agent (I) and AO-PTV apparently proceeds quantitatively, since none of the absorption spectra A–F show the absorption peaks at 2.25 eV and 4.25 eV which are characteristic of (unreacted) thianthrenium perchlorate.

Given the concentration specified above, FIG. 5 demonstrates that the transparency of AO-PTV at doping levels of 0.46 or higher within the visible range of the spectrum is similar to that of PEDOT.

Exemplary Embodiment 6

Figure 6:
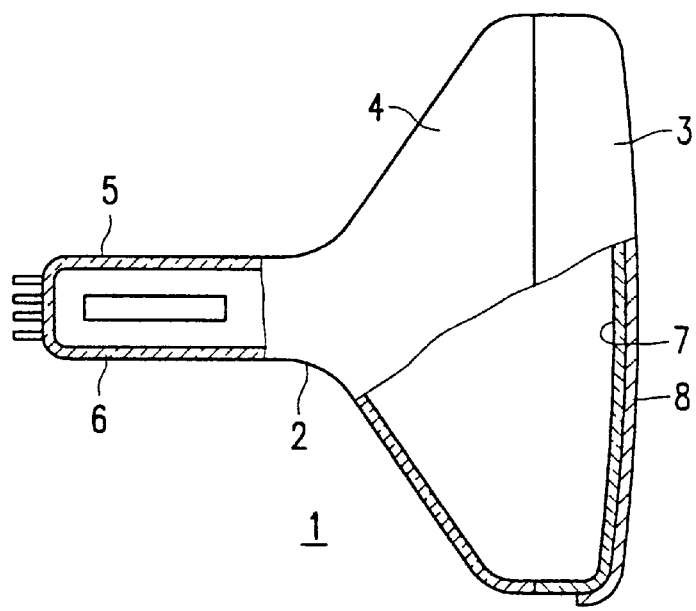

FIG. 6 schematically shows a cut-away view of a cathode ray tube 1 which is known per se and which has a glass envelope 2 comprising a display screen 3, a cone 4 and a neck 5. In the neck there is provided an electron gun 6 for generating an electron beam. The electron beam is focused on a phosphor layer provided on the inside 7 of the display screen 3. In accordance with the invention, the display screen 3 is provided on the outside with a coating 8 comprising a conjugated polymer in an oxidized state in accordance with the invention. The coating 8 may serve as an anti-static coating, and additionally, depending on its thickness, as an anti-reflective, anti-glare and/or contrast-enhancing coating. If, in addition, means to supply a voltage to said coating 8 are provided, said coating may be used as an electrochromic coating. By varying the type of conjugated polymer and thus its color in the undoped state, electrochromic coatings of any color can be obtained. By bringing the conjugated polymer into an oxidized state having a doping level of at least 0.4, the coating 8 becomes transparent.

The cathode ray tube is manufactured in a conventional manner, whereas the coating 8 is provided using the procedure of exemplary embodiment 2, where it is understood that the display screen 3 of the cathode ray tube 1 is used as the substrate.

Exemplary Embodiment 7

Figure 7:
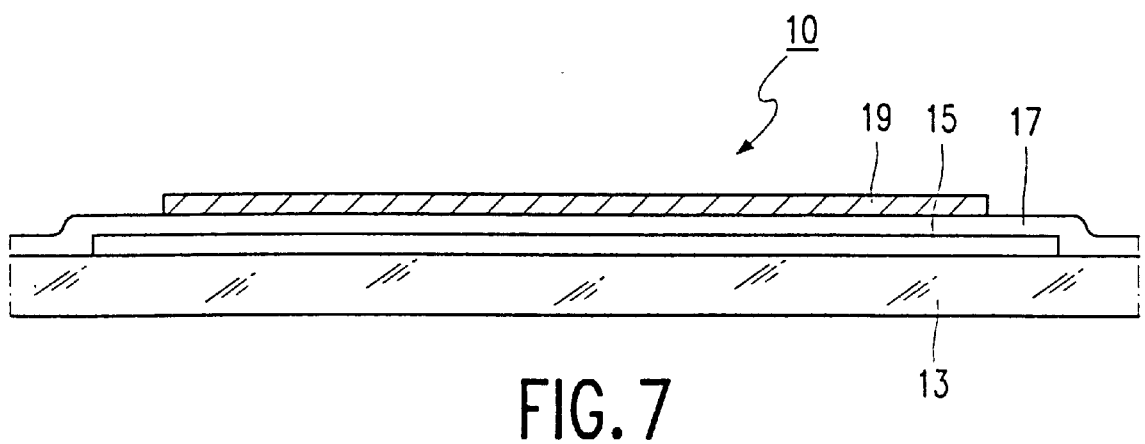

FIG. 7 schematically shows a cross-sectional view of an electroluminescent device 10 in accordance with the invention. On a transparent substrate 13 of said electroluminescent device 10 there is provided a first electrode 15 and a second electrode 19 and disposed therebetween an organic electroluminescent layer 17. The electrode 15 is an electrode transparent to visible light which, in accordance with the invention, comprises a conjugated polymer in an oxidized state having a doping level of more than 0.4. Conventionally, the electrode 15 is made of an indiumtinoxide. Alternatively, the electrode 15 may be a laminate of a layer of an indiumtinoxide and a layer of the conjugated polymer in accordance with the invention, the latter layer being disposed between the indiumtinoxide layer and the organic electroluminescent layer 17.

What is claimed is:

1. A conjugated polymer in an oxidized state, which polymer in said oxidized state has a doping level of more than 0.4 and is transparent to visible light, and which, in a neutral state, at room temperature, has a half-wave potential of more than 0.0 V vs the saturated calomel electrode.

2. A conjugated polymer in an oxidized state as claimed in claim 1, characterized in that the conjugated polymer is a polythiophene, a polythienylenevinylene or a polyphenylenevinylene.

3. A method of preparing a conjugated polymer in an oxidized state, which polymer in said oxidized state has a doping level of more than 0.4 and is transparent to visible light, in which method a conjugated polymer in a neutral state having, at room temperature, a half-wave potential of more than 0.0 V vs the saturated calomel electrode is brought into contact with an effective oxidative agent, in an amount sufficient to provide said doping level, thereby forming the conjugated polymer in said oxidized state.

4. A method as claimed in claim 3, characterized in that the oxidative agent used is a thianthrenium salt or a bis (trifluoroacetoxy)iodobenzene.

5. A substrate surface provided with a layer comprising a conjugated polymer as claimed in claim 1.

6. A substrate surface as claimed in claim 5, characterized in that the substrate surface is a surface of a display screen for a display device.

7. An electrode comprising a conjugated polymer as claimed in claim 1.

8. An organic electroluminescent device comprising electrodes and an organic electroluminescent layer disposed therebetween, wherein at least one of said electrodes is an electrode as claimed in claim 7.

* * * * *